United States Patent
Wang

(10) Patent No.: US 7,859,903 B1
(45) Date of Patent: Dec. 28, 2010

(54) METHODS AND STRUCTURES FOR READING OUT NON-VOLATILE MEMORY USING NVM CELLS AS A LOAD ELEMENT

(75) Inventor: Lee Wang, Diamond Bar, CA (US)

(73) Assignee: FlashSilicon, Inc., Diamond Bar, CA (US)

(*) Notice: Subject to any disclaimer, the term of this patent is extended or adjusted under 35 U.S.C. 154(b) by 426 days.

(21) Appl. No.: 12/031,691

(22) Filed: Feb. 14, 2008

(51) Int. Cl.
*G11C 16/04* (2006.01)
(52) U.S. Cl. .............................. 365/185.17; 365/185.11
(58) Field of Classification Search ............ 365/185.17, 365/185.11, 185.05, 63, 51
See application file for complete search history.

(56) References Cited

U.S. PATENT DOCUMENTS 7,489,546 B2 * 2/2009 Roohparvar ........... 365/185.17

* cited by examiner

*Primary Examiner*—Vu A Le
(74) *Attorney, Agent, or Firm*—Haynes and Boone, LLP

(57) ABSTRACT

A Non-Volatile Memory (NVM) cell in an NVM array is read out using other NVM cells in the array as a load element. Conventional load elements such as MOS transistors or resistors used to vary the bitline potential for the NVM cell readout in conventional NVM arrays are replaced with NVM cell(s) in the array. The omission of the extra MOS transistors or resistors for the load elements not only saves silicon area but also simplifies the bitline sensing circuitry design in the NVM array.

30 Claims, 8 Drawing Sheets

METHODS AND STRUCTURES FOR READING OUT NON-VOLATILE MEMORY USING NVM CELLS AS A LOAD ELEMENT

FIELD OF THE INVENTION

This invention relates to methods and structures for reading out Non-Volatile Memory (NVM) using NVM cells as the loading elements in the NVM array devices.

BACKGROUND OF THE INVENTION

A metal oxide semiconductor field effect transistor (MOSFET) is constructed with two electrodes ("source" and "drain") of one impurity conductivity type formed in a semiconductor substrate of opposite impurity conductivity type and separated by a channel region formed in the semiconductor substrate. The channel region is overlain by a dielectric layer (the "gate dielectric") on top of the silicon substrate. A gate electrode ("gate") is formed over the dielectric layer. In an enhancement mode MOSFET (i.e. a MOSFET which conducts a small leakage current between the source and the drain for an applied gate voltage below the MOSFET threshold voltage), when a voltage applied to the gate is over the threshold voltage of the MOSFET, the channel region of the MOSFET is inverted to make full electrical connection between the source and the drain. Non-volatile memory (NVM) cells are constructed by adding material capable of storing charge in the gate dielectric and then placing electrical charge in this material (hereinafter "storing material") which is located between the gate electrode and the channel region of the MOSFET. The storing material can be a conducting material such as highly doped polysilicon, charge trapping dielectric such as a nitride film, or nanocrystals. By placing charge in the storing material in an NVM cell, the threshold voltage of the MOSFET can be altered. The stored charge represents information to be stored. By varying the amount of charge stored in or on the storing material, the value represented by the charge stored in the storing material can be varied. Variable information (typically in the form of n-bit digital binary words converted to analog signals) can thus be stored in or on the storing material by placing various amounts of charges in or on the storing material to alter different threshold voltage levels of NVM cells. The stored charge in an NVM cell is not volatile even when the power for the NVM is turned off. The information can be retrieved by reading out the stored threshold level of the NVM cell in which the information is stored.

The conventional reading out of the threshold voltage of an NVM cell is done by applying a constant voltage or multiple stepped voltages to the control gate of the NVM cell with the drain electrode connecting to a loading element such as a transistor or a resistor. When a read voltage bias is applied to the loading element connected in series with the NVM cell's drain electrode and the applied NVM's gate voltage is sufficient to turn on the MOSFET in the NVM cell, electrical current thus flows through the load element to and through the NVM cell. The current and the voltage at the node between the NVM cell and the loading element will respond according to the NVM cell threshold voltage and applied gate voltage. In the constant control gate voltage readout scheme, the current flowing through the load element and NVM cell is compared to the current flowing through the same configuration with the load element connected to a referencing NVM cell under the same voltage bias condition. The result of the comparison is applied to determine the stored information in the NVM cell.

In the conventional stepped voltage scheme, various voltages are applied in sequence to the control gate of an NVM cell for reading out. By applying a voltage bias through the load element to the NVM cell, the voltage at the node between the NVM cell and the load element is detected as a function of the applied gate voltage and the cell threshold voltage. The information stored in the NVM cell is then readout when the voltage applied to the gate of the MOSFET in the NVM cell is just sufficient to turn on the MOSFET in the NVM cell. For example, in Samsung's 128 Mb multilevel NAND flash designs (Tae-Sung Jung et. al., IEEE Journal of Solid-State Circuit, Vol. 31, No. 11, November 1996), a P-type transistor as a load element biased with a reference gate voltage is connected to the NAND NVM string. The voltages at the node between the load element and the NAND cell string vary according to the gate voltage applied to the selected cell and the cell's stored threshold voltage level. The various voltages at this node are applied to pull a latch in an output buffer to convert the stored information in the NVM cell into digital format.

BRIEF SUMMARY OF THE INVENTION

In accordance with this invention, instead of using an extra transistor or resistor for a loading element, an NVM cell or a series of plural NVM cells in the NVM array are used as the loading element for reading out the stored information in each NVM cell. An immediate benefit of this invention is that the loading element can be omitted in the NVM array readout peripheral circuitry. Since the bitline pitch of an NVM array is usually the minimum pitch allowed by the design rules for the process technology being used to implement the NVM array in semiconductor material, such as silicon, the omission of the loading element along the bitlines in an NVM array not only saves silicon area but also simplifies the metal line routing inside the already crowded tight pitch spacing in NVM array layouts. The silicon area saving and simplified metal line routing can lead to a smaller chip size and fewer metal layers in the NVM array. In other words, the NVM array can be manufactured with lower manufacturing cost.

It is well known that when a MOSFET is running in the linear region, where the magnitude of the applied gate voltage relative to the source voltage over the device threshold voltage is much higher than that of the drain voltage relative to the source voltage, an inversion layer on the surface of the MOSFET channel is formed to electrically link the source electrode and drain electrode. The inversion layer is filled with mobile charge carriers such as electrons for an N-type MOSFET and holes for a P-type MOSFET, respectively. Under this linear condition, the MOSFET behaves like a resistor. The current flowing through the MOSFET is proportional to the applied voltage bias between the source electrode and the drain electrode. Thus, in accordance with this invention, the use of a MOSFET in its linear mode of operation to serve as a load element for the reading out of the information stored in an NVM cell saves semiconductor area and reduces manufacturing costs.

This invention will be more fully understood in view of the following detailed description taken together with the drawings.

BRIEF DESCRIPTION OF THE DRAWINGS

For a better understanding of the present invention and to show how it may be carried into effect, reference will now be made to the following drawings, which show the preferred embodiments of the present invention, in which.

DETAILED DESCRIPTION

The following detailed description is meant to be illustrative only and not limiting. Other embodiments of this invention will be obvious to those skilled in the art in view of the following description.

Figure 1:
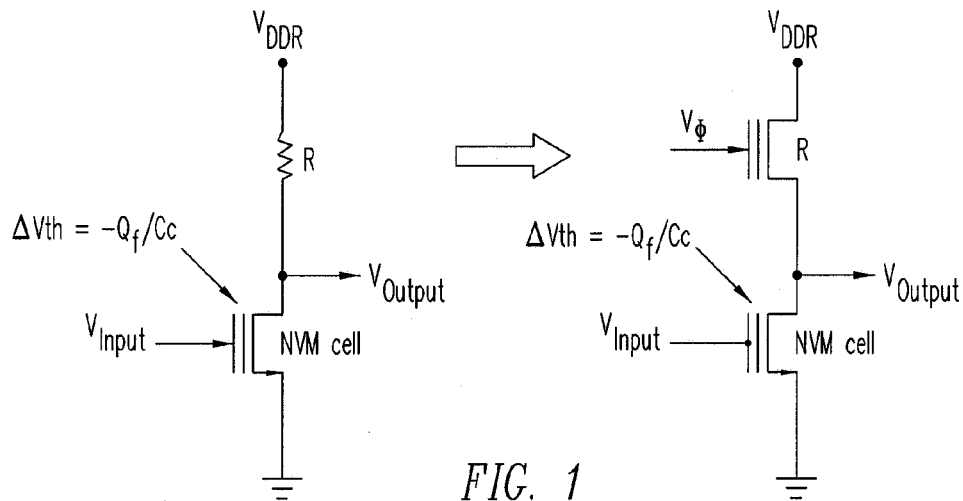
FIG. 1 shows the schematic of an N-type non-volatile memory (NVM) cell connected in series with a resistor load R and the schematic of an N-type non-volatile memory (NVM) cell connected in series with MOSFET from an NVM cell to function as a load resistance in accordance with this invention.

FIG. 1 (left side) is the schematic of an NVM cell connected with a 1 MΩ-resistor load. A source of bias voltage $V_{DDR}$ is connected to one electrode of the resistor and the other electrode of the resistor is connected to one electrode of the NVM cell. The other electrode of the NVM cell connected to ground. An input voltage is applied to the gate of the NVM cell and the output voltage is the voltage at the node between the resistor load and the NVM cell. As shown in FIG. 1, resistor R can be replaced by one NVM cell (or multiple NVM cells) biased with a high gate voltage $V_\phi$ such that the NVM cell load (or NVM cells load) is operated in the linear mode and behaves like a resistor load.

Figure 2A:
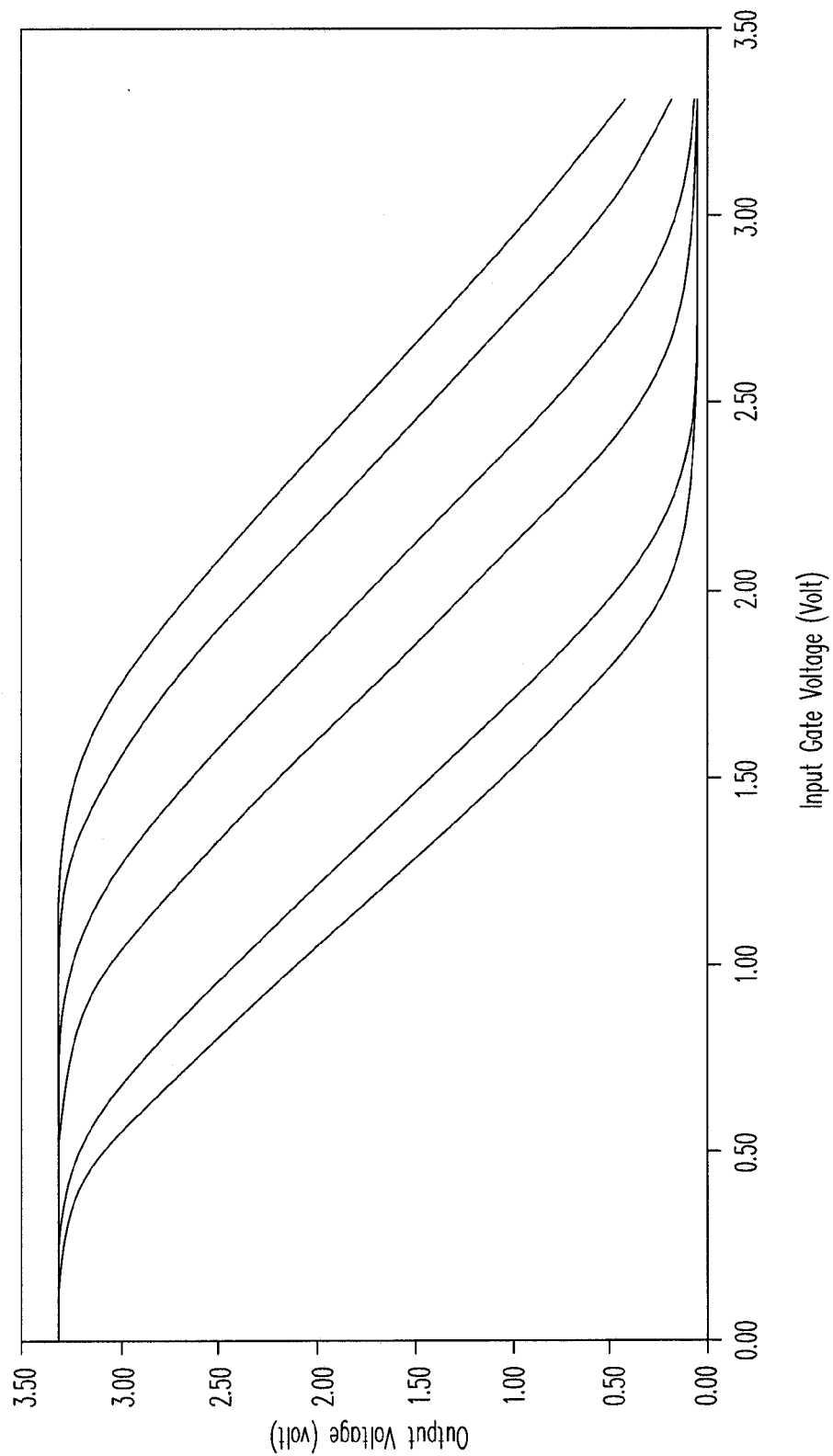
FIG. 2 shows the input/output voltage measurement data according to the schematic shown in FIG. 1 with a one (1) MΩ-resistor as the load in the schematic for both (a) 0.35 μm single-poly NVM cell and (b) 0.18 μm floating gate NVM cell. The parallel curves in the figures are for the same cells with different programmed threshold voltages.
Figure 2B:
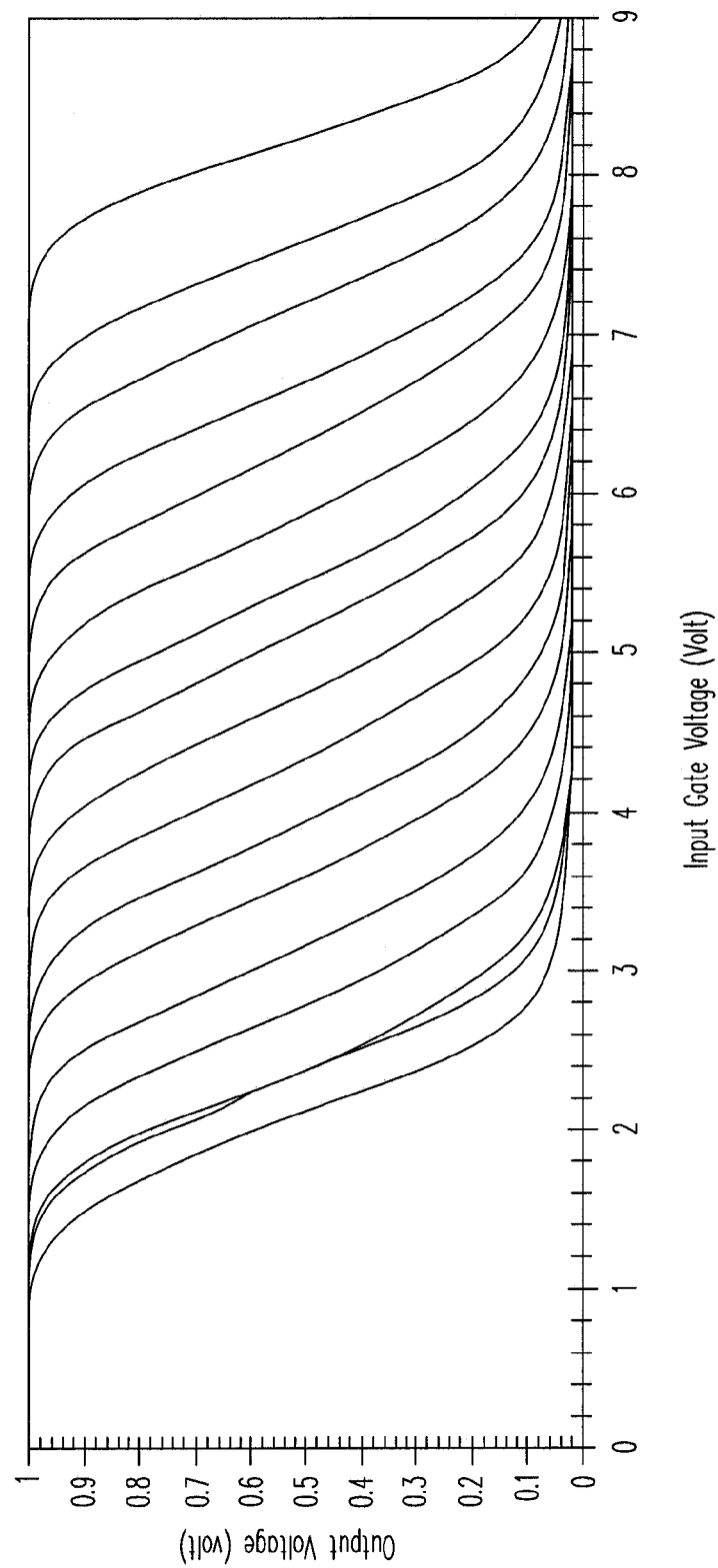

FIGS. 2(a) and 2(b) are two sets of voltage measurement data for a 0.35 μm single-poly NVM cell and a 0.18 μm floating gate NVM cell, respectively, each in series with a one (1) MΩ resistor. The parallel input/output curves in FIGS. 2(a) and 2(b) are measured for the same cells with different programmed threshold voltages. When the gate voltage applied to each NVM cell increases, the output voltage reaches an asymptotic constant voltage as seen in FIGS. 2(a) and 2(b). In the asymptotic constant voltage region, the NVM cells are operated far beyond the linear mode region into the deep linear mode region. In the deep linear mode region, the equivalent resistance of a MOSFET is independent of the applied gate voltage. This is because the mobility degradation of mobile charge carriers in the inversion layer (inversely proportional to gate voltage) is compensated due to the effect of the mobile charge density increase (proportional to gate voltage). Regardless of the cell threshold voltages, the asymptotic constant voltage at the node between the 1 MΩ-resistor R and the NVM cell is given by the total applied voltage across the 1 MΩ-resistor R and the NVM cell in series divided by two equivalent resistors. The equivalent resistances from the measured 0.35 μm single-poly NVM cell and 0.18 μm floating gate NVM cell are 8 KΩ and 10 KΩ, respectively as the applied gate voltage to the NVM cell is large enough to operate the NVM cell in deep linear mode.

The resistor load R in the schematic on the left side of FIG. 1 can be replaced with a MOSFET or series-connected MOSFETs from one or more NVM cells as shown on the right side of FIG. 1. Each MOSFET in the series connected NVM cells is biased with a high enough gate voltage applied to the gate of each of the one or more series connected NVM cells such that the gate voltage applied to the MOSFET in each NVM cell over the maximum programmed threshold voltage relative to the MOSFET's source voltage is much greater than the MOSFET's drain voltage relative to the MOSFET's source voltage in each of the NVM cells. Each NVM cell with such a high gate voltage bias thus operates in linear mode and behaves equivalently like a resistor independent of the charge stored on the storing material in the cell. The ordinary current sensing schemes or voltage sensing schemes can be applied to sense the potential at the node between the NVM cell (or NVM cells) load (resistor load) and the NVM cell to be read.

Figure 3A:
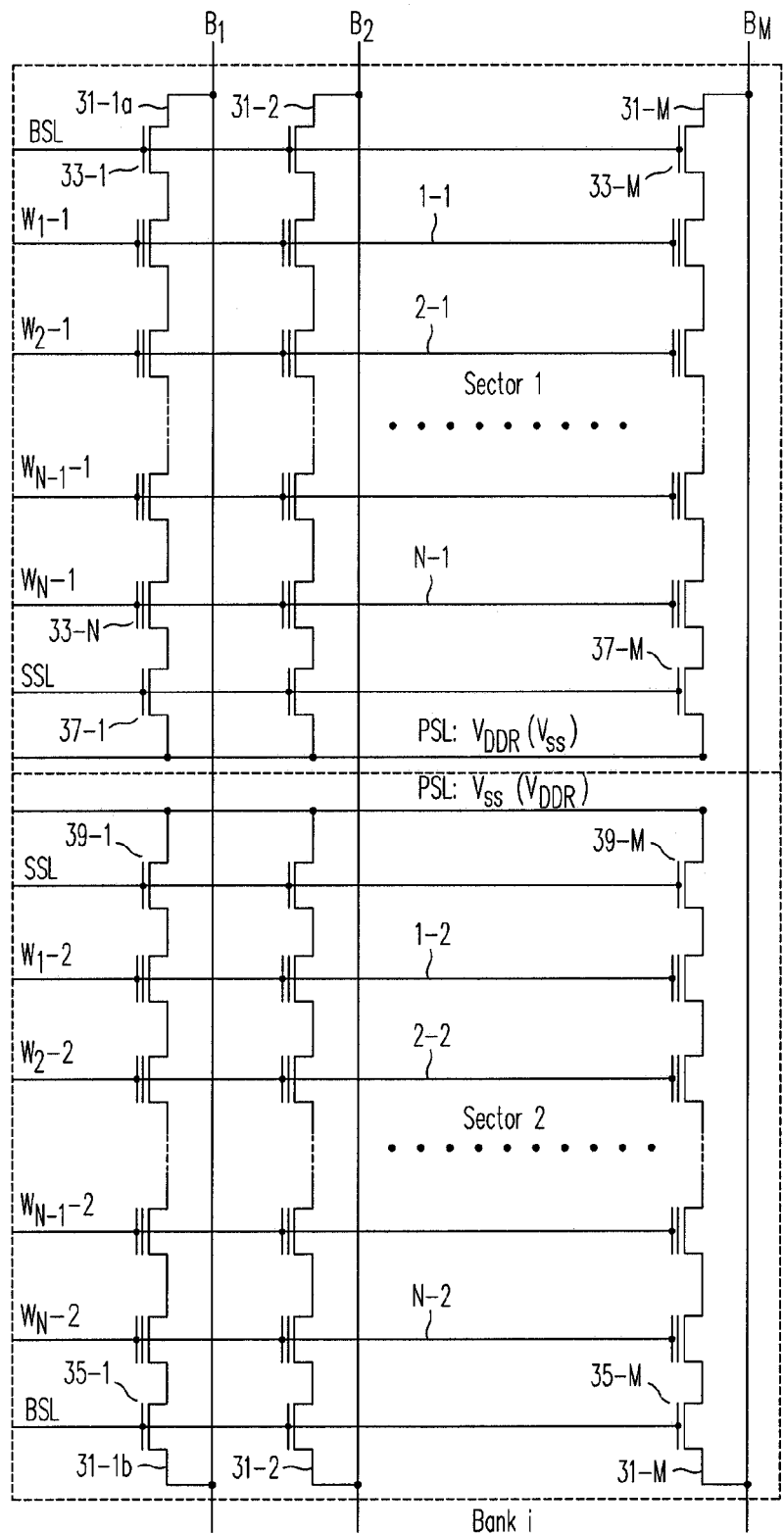
FIG. 3 shows the schematic for a NAND array wherein each NAND string consists of "N" NVM cells, where N in an integer representing the number of NVM cells in a string and "M" NAND strings form a sector.
Figure 3B:
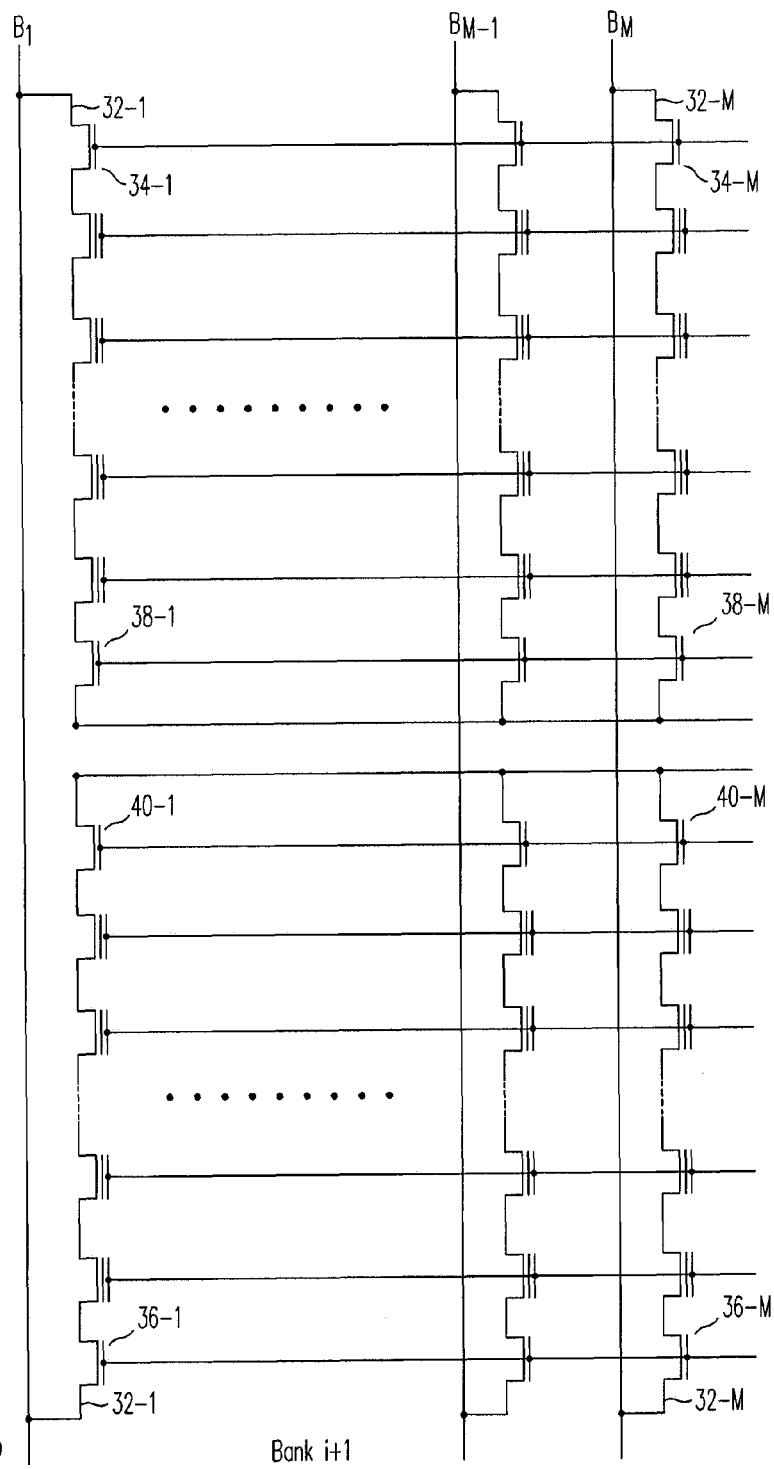
Figure 4:
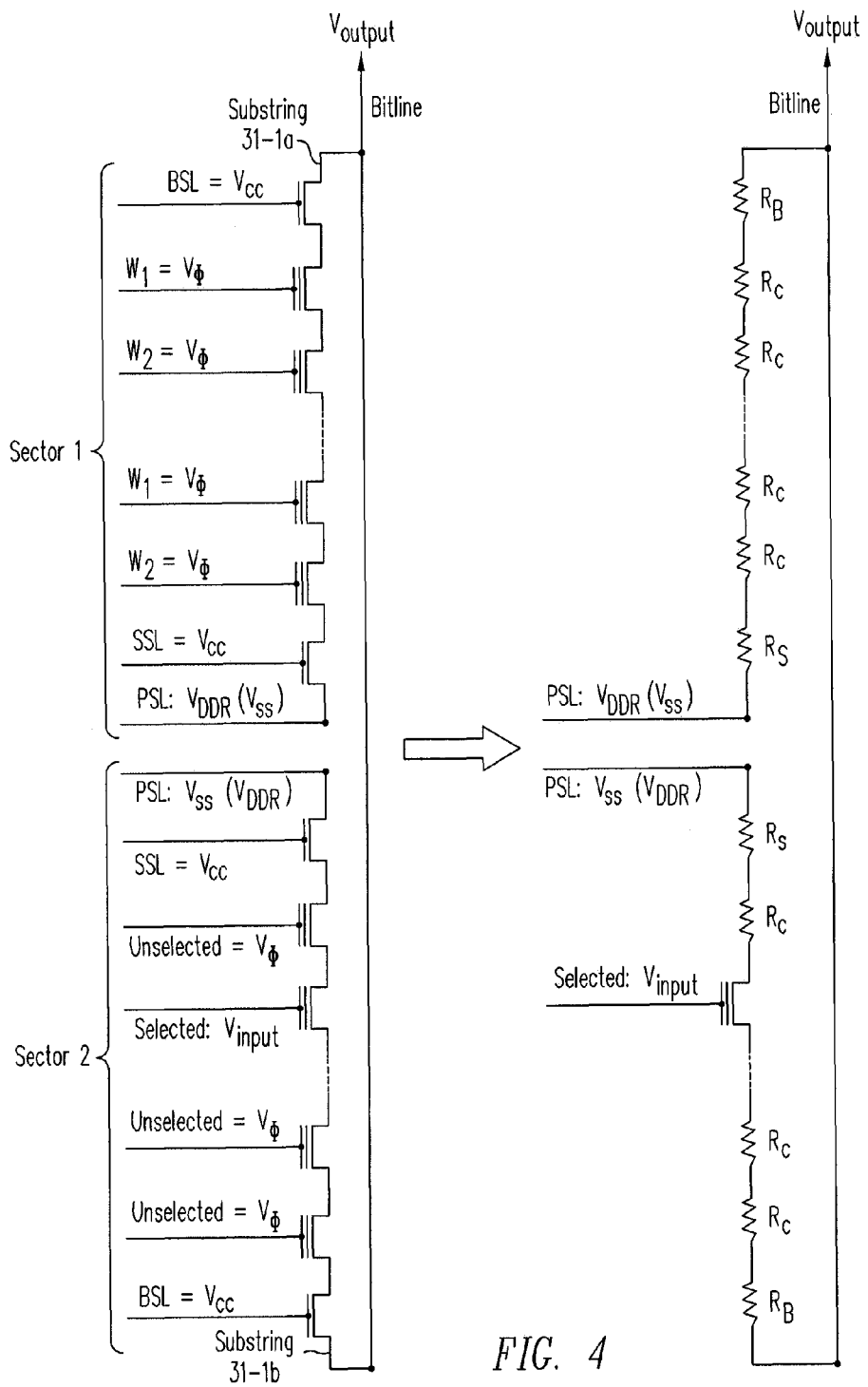
FIG. 4 shows the equivalent circuit schematic for a pair of NAND strings in read operation.

FIG. 3 shows a schematic of a NAND flash array. Bitline Select Line (BSL) MOSFETs are provided to connect each bitline $B_m$ to a corresponding string of NVM cells. Thus bitline select line MOSFETs 33-1 and 35-1 associated with bitline $B_1$, are provided to connect a NAND string 31-1 to corresponding array bitline $B_i$. String 31-1 is shown in FIGS. 3 and 4 as having portion 31-1a (also called substring 31-1a) in Sector 1 of bank i and portion 31-1b (also called substring 31-1b) in Sector 2 of bank i. Shown in FIG. 3 are NAND strings 31-1 to 31-M in bank i and NAND strings 32-1 to 32-M in bank i+1. The phrase "NAND string 31-m" or "NAND string 32-m" will sometimes be used to reference any one of NAND strings 31-1 to 31-M or NAND strings 32-1 to 32-M, respectively, where "m" is an integer given by 1≦m≦M, and "M" is the maximum number of NAND strings 31 in a pair of vertically-aligned sectors of bank i and of NAND strings 32 in a pair of vertically-aligned sectors of bank i+1.

Supply Select Line (SSL) MOSFETs, such as MOSFET 37-1 and MOSFET 39-1, are used to connect a NAND string, such as NAND string 31-1, to Power Supply Lines (identified in FIGS. 3 and 4 with the notation PSL) biased with a readout voltage source (high voltage $V_{DDR}$ or low voltage $V_{SS}$, as shown for one embodiment in FIGS. 3 and 4). As shown in FIG. 3, each NAND string 31-m consists of "N" NVM cells connected in series in a sector. A "bank" of NVM cells, such as bank i, is shown in FIG. 3 as having a first sector 1 and a second sector 2, respectively. It should be noted that "P" sectors can be aligned in one column to form a bank of the flash array where "P" is a selected even-numbered integer.

Each NAND string 31-m is oriented vertically in its sector. The NVM cells in a row, such as row 1-1 in the top sector 1 of Bank i, are connected to a wordline, such as wordline $W_1$-1, where the subscript represents the row (thus subscript "1" stands for the first word line) and the "-1" represents "sector 1" or the first sector in bank i. "M" NAND strings, each string with N NVM cells connected in series, make up a sector of a bank. "N" and "M" are selected integers. N, for example, can be thirty two (32), sixty four (64) or one hundred twenty eight (128) while M can be 1024 or 2048 plus some redundant cells in one row. N and M can be other numbers, if desired. Word lines in the top sector 1 of a bank, such as bank i, are numbered as $W_n$-1, while wordlines in the second sector 2 of a bank are numbered as $W_n$-2, where the subscript "n" represents the $n^{th}$ row and is an integer given by $1 \leq n \leq N$. A pair of adjacent banks (shown in FIG. 3 as Bank i and Bank i+1) forms a mirrored image horizontally (i.e. along a row). The total NAND flash array consists of several ("Q", where "Q" is a selected integer) banks of NVM cells. The number of NVM cells in each string of NVM cells in sectors 1 and 2 of bank i in FIG. 3 are shown as being the same. However, this is not necessary and the number of NVM cells in a string in sector 1 can be different from the number of NVM cells in the corresponding string in sector 2 of the same bank, if desired.

In FIG. 3, referring to bank i, both ends of each NAND flash string 31-$m$ are connected to the select gate transistors BSL (shown in sector 1 of bank i as 33-$m$ and in sector 2 of bank i as 35-$m$) and SSL (shown in sector 1 of bank i as 37-$m$ and in sector 2 of bank i as 39-$m$). For example, the Bitline Select Line (BSL) MOSFETs 33 and 35 are the gate transistors to connect the top ends of the NAND strings 31 in sector 1 of bank i, and the bottom ends of the NAND strings 31 in sector 2 of bank i to the bitlines $B_m$. With both BSLs 33-$m$ and 35-$m$ "on" to connect the paired NAND strings 31-$m$ in sectors 1 and 2 to the bitline $B_m$, the same numbered NAND strings in sectors 1 and 2 are connected to a corresponding bitline to form a series of M NAND strings. The Supply Select Line (SSL) MOSFETs 37-$m$ and 39-$m$ in sectors 1 and 2, respectively, of bank i are the gate transistors to connect one end of the NAND strings 31-$m$ in each of sectors 1 and 2 to a corresponding Power Supply Line (PSL), where the PSL line can be supplied with a positive voltage or ground. With a positive voltage ($V_{DDR}$) supplied to one end of the paired NAND string such as NAND substring 31-1$a$ in sector 1 and ground ($V_{SS}$) supplied to the other end of the paired NAND string such as NAND substring 31-1$b$ in sector 2, the current loop of the paired NAND substrings 31-1$a$ and 31-1$b$ in sectors 1 and 2 connected by bitline $B_1$ is generated by the supplied voltage bias $V_{DDR}$ minus $V_{SS}$. The voltage potential variations at the bitline $B_1$ due to the current flowing through the paired NAND substrings 31-1$a$ and 31-1$b$ in sectors 1 and 2 can be sensed by a sense amplifier. The sense amplifiers and bitline switches (not shown in FIG. 3) for bitlines are located in the middle of one bank and on both sides of one bank, where a single unit of sense amplifier and bitline switch can occupy four bitline pitches. Two adjacent sectors in a pair of adjacent banks, such as bank i and bank i+1 in FIG. 3, share the same isolated P-type well and form a mirror image of each other horizontally as shown in FIG. 3.

To read out the NVM cells along one row in one sector (such as sector 1 in bank i), the wordlines $W_1$ to $W_N$ in the loading sector used for resistor loading are activated by applying a high voltage to each wordline such that the NAND strings in this sector all behave like a series of resistors. For the other probed sector containing the NVM cell to be read out, the NVM cells associated with the one word line $W_n$ selected (the "selected word line") to have the information stored in each of the cells connected to this word line read out will have a series of increasing voltages applied to this word line during the reading out of the stored information. However, the unselected wordlines in this probed sector (all wordlines except $W_n$) are all biased with a high voltage $V_\Phi$ such that the pairs of NAND substrings 31-1 to 31-M in sectors 1 and 2 are electrically and conductively linked up to the two sides of the selected NVM cells to be read out. Gating transistors 33-$i$, 35-$i$, 37-$i$, and 39-$i$ are all turned on by applying a sufficient gate voltage $V_{cc}$ to the gates of each of these transistors. Then in one embodiment a positive voltage bias $V_{DDR}$ is applied to the PSL line for the loading sector, while $V_{SS}$ (ground) is applied to the PSL line for the probed sector in the pair of the mirrored adjacent sectors 1 and 2 in bank i. A constant voltage or a sequence of step voltages are then applied to the selected wordline $W_n$ in the probed sector to probe the threshold voltages of the NVM cells connected to W. The voltages at each bitline $B_m$ in bank i respond according to the threshold voltage level representing the information stored in the NVM cell being read in that bitline. The resulting voltages on bitlines $B_1$ to $B_M$ associated with the row of NVM cells connected to wordline $W_n$ can be sensed, amplified, compared, determined, and converted into the corresponding digital information simultaneously. The equivalent circuit schematic for a single paired NAND string corresponding to NAND substrings 31-1$a$ and 31-1$b$ in bank i is shown in FIG. 4. To avoid cluttering FIG. 4, numbers are not placed on certain elements shown in FIG. 4 but selected ones of these elements are numbered in FIG. 3. Substrings 31-1$a$ and 31-1$b$ are part of NAND string 31-1 in bank i.

Figure 5:
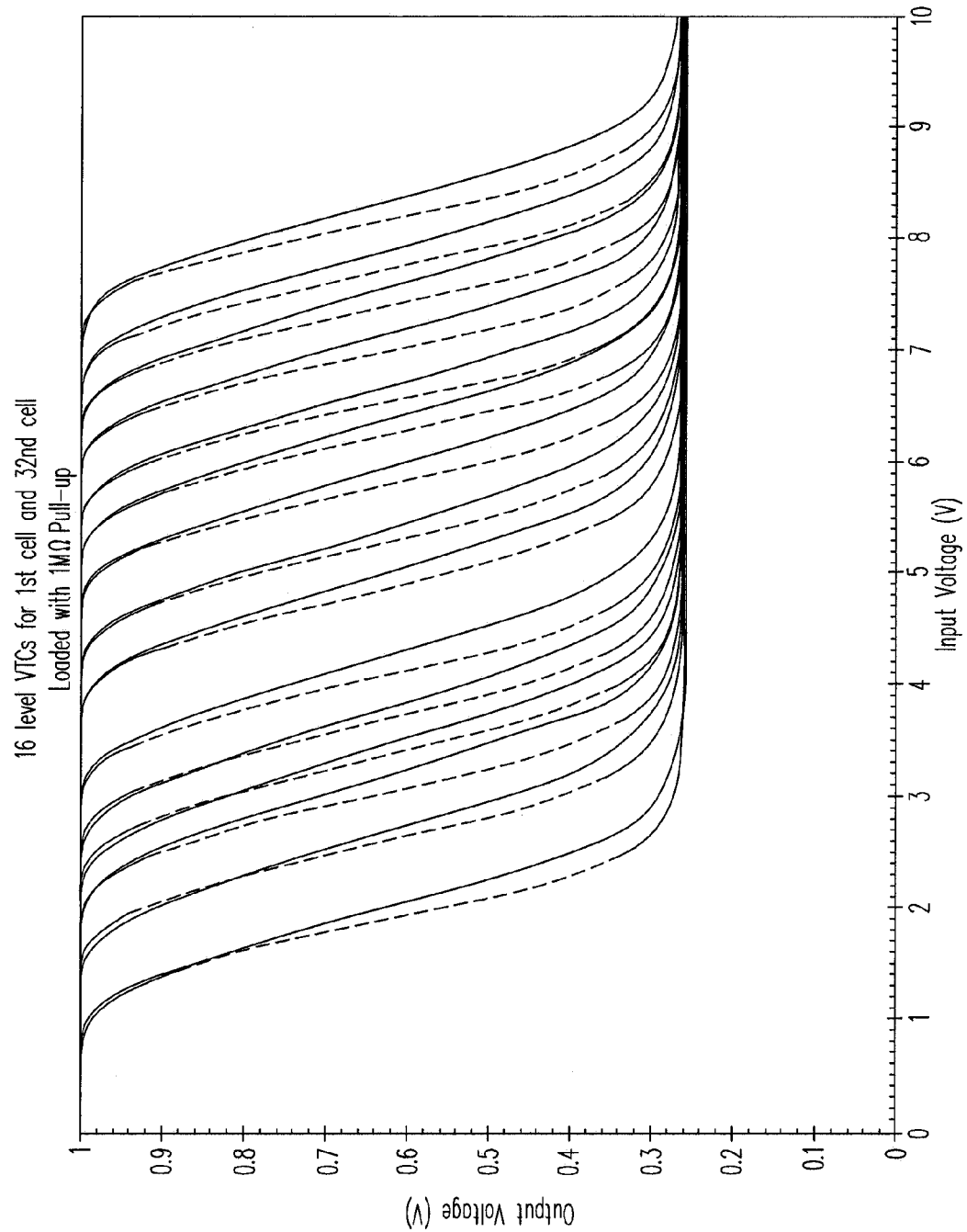
FIG. 5 shows the measurement data for the selected gate input voltage versus the output voltage at the bitline for first cell (solid lines) and $32^{nd}$ cell (dashed lines) with 1 MΩ resistor load (approximately equivalent to a 128-cell NAND string biased in deep linear mode) with 1 volt for $V_{DDR}$ in a one hundred twenty eight (128) cell NAND string.

FIG. 5 shows the measurement data for the selected gate voltage versus the output voltage at the bitline for the first cell (solid lines) and $32^{nd}$ cell (dashed lines) for a 1 MΩ resistor load (approximately equivalent to a 128-cell NAND string load biased in deep linear mode) with 1 volt for $V_{DDR}$. As seen from FIG. 5, the parallel lines are for different threshold voltage levels, which represent $2^n$ levels of information (i.e. n bits where "n" is an integer) stored in the NVM cell being read out. According to FIG. 5, when the gate voltage applied to each of the NVM cells not being read out in a string of such cells reaches 10 volts, these NVM cells in the NAND string become resistors independent of applied gate voltage even for the maximum programmed threshold voltage of 7 volts. For a pair of NAND substrings with an identical number of NVM cells in each substring, such as NAND substrings 31-1$a$ and 31-1$b$ connected as shown in FIG. 4, the asymptotic output voltage at the bitline $B_m$ will reach one half of the positive voltage bias $V_{DDR}$.

When the PSL line connected to the load element substring (such as substring 31-1$a$ in FIG. 4) is supplied with ground ($V_{ss}$) voltage, each bitline $B_m$ output voltage will start initially from ground and rise to ½ $V_{DDR}$, when the applied gate voltage on the selected wordline (identified as "Selected: $V_{input}$" in string 31-1$b$ in FIG. 4) turns on the NVM cells connected to this wordline according to their stored threshold voltage levels.

In another embodiment for the same NAND array architecture, all the wordlines in both loading and probed sectors (such as sectors 1 and 2 of bank i in FIGS. 3 and 4), are initially activated by applying a high voltage such that the pairs of NAND substrings (such as substrings 31-1$a$ and 31-1$b$ in FIGS. 3 and 4) in both sectors all behave like a series of resistors. Then one can apply a positive voltage bias $V_{DDR}$ to the PSL line in the probed sector (shown as sector 2 in FIG. 4), while $V_{ss}$ (ground) is applied to the other PSL line in the loading sector (shown as sector 1 in FIG. 4) for the pair of mirrored adjacent sectors 1 and 2 in bank i. The bitline output voltages at all the bitlines are initially at one half of $V_{DDR}$ as the potential of each bitline $B_m$ is at the middle point of two equivalent identical series resistors formed, for example, by the turned-on NVM cells in substrings 31-1$a$ and 31-1$b$ (FIG. 4). The voltage (shown as $V_{input}$ in sector 2 of FIG. 4) applied to the selected wordline connected to the row of NVM cells in which the information stored is to be read out can be stepped down from the initial high voltage to a constant probing voltage or several stepped voltages can be applied in sequence to the selected wordline for probing the threshold voltage levels of the NVM cells connected to the selected wordline.

For the loading sector with the PSL line connected to ground ($V_{ss}$), shown, for example, as sector 1 in FIG. 4, the output voltages at the bitlines $B_m$ in response to the stepped down gate voltage will be moving toward ground according to the programmed threshold voltages in the NVM cells. If the loading sector has its PSL line connected to $V_{DDR}$, the bitline $B_m$ output voltages in response to the stepped down gate voltage on the selected word line will be moving toward $V_{DDR}$ according to the programmed threshold voltages in the NVM cells connected to the selected wordline. Consequently, the variation of output voltages at the bitlines $B_1$ to $B_M$ for the selected NVM cells with various threshold voltage levels can be sensed, amplified, compared, determined, and converted into digital information corresponding to the information stored in the NVM cells connected to the selected wordline.

Since all the NVM cells in this embodiment are initially operated in linear mode, there are no depletion regions under the channel surface near the drain sides of any NVM cells in the NAND string to generate hot carriers near the channel surface. The Hot Carrier Injection (HCI) into the gate insulation (typically silicon oxide) of the MOSFET in an NVM cell due to the electric field across such insulation can result in a slight alteration of the NVM stored threshold voltage for the phenomenon of so-called "read disturbance". In this embodiment the read disturbance is minimized due to no initial depletion region near the drain side of the selected NVM cells. When the applied gate voltage for the selected NVM cells is below, or falls below, the threshold voltages of the selected NVM cells, the currents flowing through the paired NAND substrings (such as substrings 31-1a and 31-1b in FIG. 4) from $V_{DDR}$ to $V_{ss}(0)$ to create ½ $V_{DDR}$ at the bitlines $B_1$ to $B_M$ is cut off. Therefore, the bitlines $B_m$ are either charged to $V_{DDR}$ or drained to ground through the closed loop between the corresponding bitlines and the load NAND strings.

Figure 6:
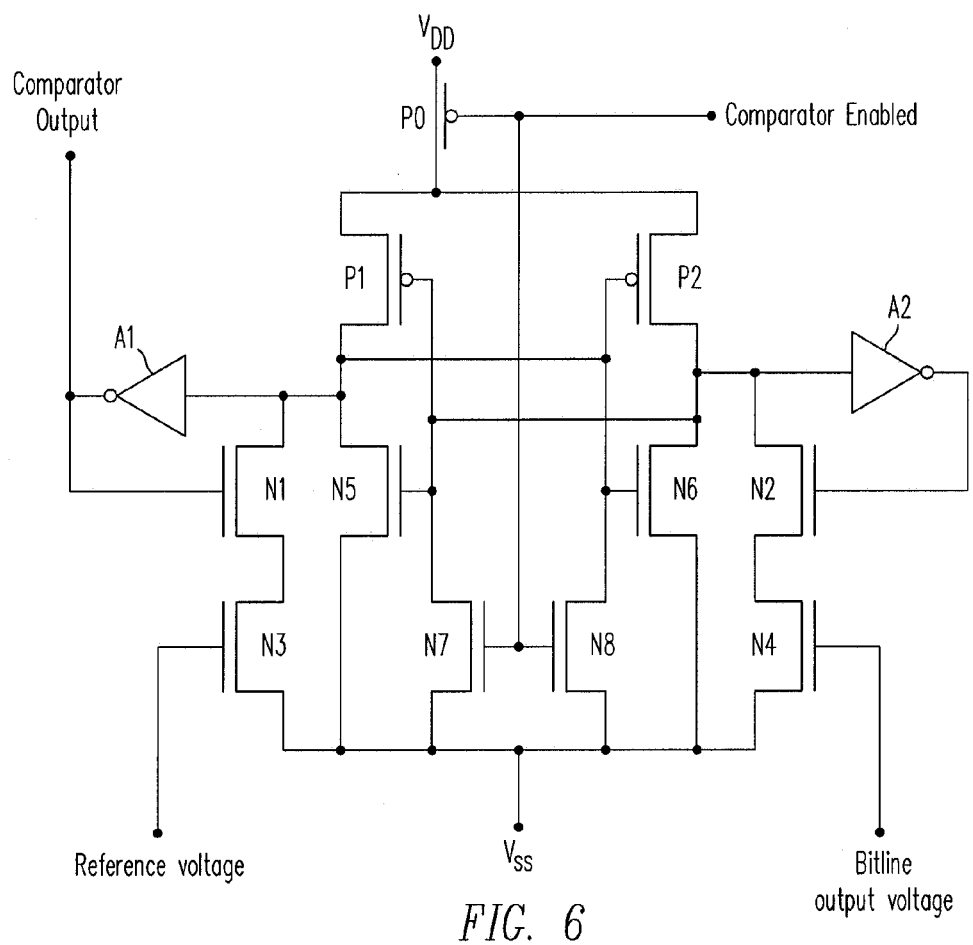
FIG. 6 shows one embodiment of voltage comparator circuitry using a reference voltage to sense the voltage variation on the bitline in response to the selected gate voltage and the NVM cell's threshold voltage. If the bitline voltage is greater than the reference voltage, the output of the comparator becomes high ($V_{DD}$) and when the bitline voltage is less than the reference voltage, the output voltage of the comparator becomes low ($V_{SS}$).

FIG. 6 shows one embodiment of well-known voltage comparator circuitry using a reference voltage to sense the voltage variation on the bitline $B_i$ in response to the selected gate voltage and the NVM cell's threshold voltage. The well-known sense amplifier in FIG. 6 operates as follows. When the enable signal applied to the gate of P-type MOSFET P0 is high, P-type MOSFET P0 connecting the remaining components of the sense amplifier to the supply or bias voltage $V_{DD}$ is off. Thus the bias voltage $V_{DD}$ does not get into the latch circuitry which includes symmetrical cross-over P-type MOSFETs P1 and P2 and two sets each of four N-type MOSFETs. Thus N-type MOSFETs, N1 and N3 are connected in series but connected in parallel to series-connected N-type MOSFETs N5 and N7. Series-connected N-type MOSFETS N2 and N4 on the right side of the sense amplifier are connected in parallel with series-connected N-type MOSFETs N6 and N8. The high enable signal turns the two N-type MOSFETs N7 and N8 near Vss (ground) on. So the crossover nodes of the latch (which are connected to the gates of P-type transistors P1 and P2) have been equalized to Vss through the N7 and N8. When the enable signal is "low" (the sensing state), P0 is "on" and N7 and N8 are "off". The current paths to Vss through N7 and N8 are cut off and current can only flow through N1, N3, and N5, and symmetrically through N2, N4, and N6. Since the reference voltage is applied to the gate of N3 and the bitline voltage is applied to the gate of N4, the current flowing through the left odd numbered MOSFETs and the current flowing through the right even numbered MOSFETs is compared. Depending on the relative magnitudes of the applied reference voltage and bitline voltage N3 and N4 are turned on differently. Through the positive feedback of latch circuitry, the circuitry output will accelerate to pull up with Vdd or down with Vss, depending on whether or not the reference voltage turns on N3 more than the bitline voltage turns on N4 or vica versa. The function of the two inverters on each side for the output is to further accelerate the positive feedback for faster sensing (two-stage amplification).

Thus if the bitline $B_m$ voltage is greater than the reference voltage, the output of the comparator becomes high ($V_{DD}$). If the bitline $B_m$ voltage is less than the reference voltage, the output voltage of the comparator becomes low ($V_{SS}$). This high/low voltage can be applied to control logic circuitry to write the information stored in the NVM cell connected to bitline $B_m$ in digital format into a data buffer. See co-pending patent application Ser. No. 11/378,074 entitled "Bit Symbol Recognition Method and Structure for Multiple Bit Storage in Non-Volatile Memories", filed Mar. 16, 2006 and assigned to FlashSilicon, Inc., the assignee of this application, for a description of one implementation for such logic circuitry. Application Ser. No. 11/378,074 is hereby incorporated herein by reference in its entirety. Of course, sense amplifiers other than as shown in FIG. 6 can also be used with this invention.

Figure 7:
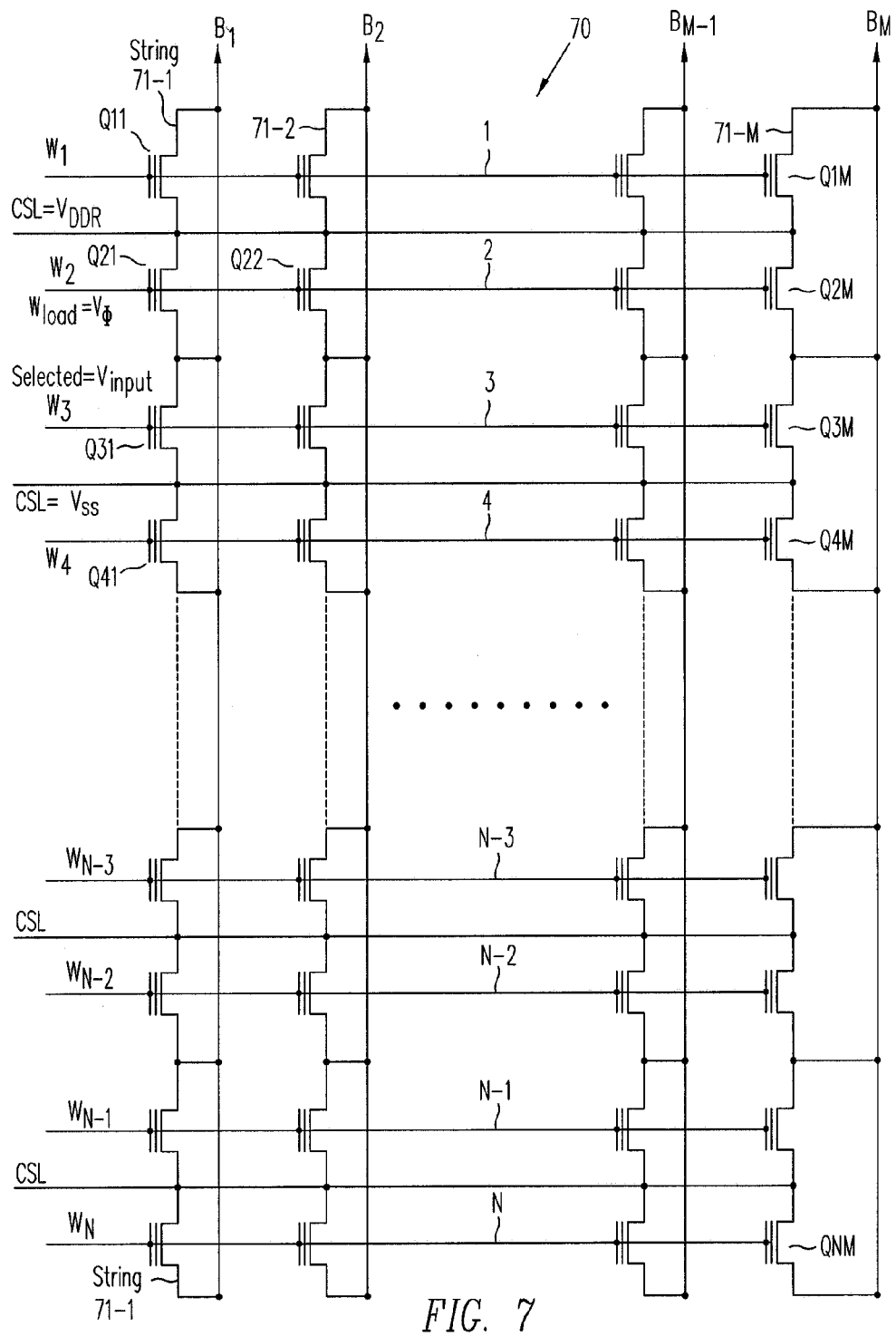
FIG. 7 shows the structure of an "N×M" NOR-type flash array and illustrates its read operation when using NVM cells for loading elements. The Common Source Line (CSL) can be supplied with a high read voltage $V_{DDR}$ or low read voltage $V_{SS}$.

FIG. 7 shows an "N×M" NOR-type flash array 70. In the NOR flash array 70 in accordance with this invention, the Common Source Line ("CSL") can be switched to either a positive voltage bias $V_{DDR}$ or $V_{SS}$ (ground), in contrast to the conventional NOR type flash array, where the source line is only connected to $V_{SS}$ (ground).

To read out the NOR flash array 70, the wordline $W_n$ (where "n" is an integer given by $1 \leq n \leq N$ and N is the number of rows in array 70) for the one row "n" containing those NVM cells (Qn1 to QnM) which will be the load elements is supplied with the maximum high voltage $V_\phi$ such that all the NVM cells (Qn1 to QnM) connected to this wordline are operated in the linear mode and function as resistors. The source and drain electrodes of each NVM cell (Qnm) (where m is an integer given by $1 \leq m \leq M$ and M is the maximum number of strings of NVM cells in array 70) connected to this wordline are linked (i.e. electrically connected by the channel region of the MOSFET in each NVM cell) with inverted mobile carriers in the channel region of each inverted MOSFET. The common source line CSL connected to one electrode of the load element Qnm in each string 71-1 to 71-M of MOSFETs (such as MOSFETs Q21 to Q2M in row 2) is then biased with a positive voltage $V_{DDR}$ or $V_{SS}$ (ground), while the common source line CSL connected to one electrode of each NVM cell (such as MOSFETs Q31 to Q3M) in the row 3 of MOSFETS to be read under the selected wordline $W_3$ is biased with $V_{SS}$ (ground) or a positive voltage $V_{DDR}$. The voltages on the output bitlines $B_1$ to $B_M$ are initially at $V_{DDR}$ for the former case or $V_{SS}$ (ground) for the latter case. Either a constant voltage is, or stepped voltages are, then applied to the selected wordline $W_3$ to probe the threshold voltages of the MOSFETs Q31 to Q3M in the selected row 3 of NVM cells. All the other wordlines in array 70 are kept at a voltage such that the NVM cells (represented by MOSFETs Qnm) connected to these other wordlines do not conduct regardless of the information stored on these cells. Thus the voltage potentials on the bitlines $B_1$ to $B_M$ vary accordingly as a function of the voltage applied to the selected wordline $W_3$ and the threshold voltage levels representing the information stored in the NVM cells comprising MOSFETs Q31 to Q3M connected to the selected wordline. The voltage potential corresponding to each bitline can be sensed, amplified, compared, determined, and converted into the stored digital information in each NVM cell.

Of course, in the above description, the MOSFETs Q11 to Q1M in row 1 could have been substituted for the MOSFETs Q21 to Q2M in row 2 and the MOSFETS Q41 to Q4M in row 4 could have been substituted for MOSFETs Q31 to Q3M in row 3. To read out the information stored on any one row, such as row 3, any one of rows 1, 2 and 5 to N can be selected to provide the load elements. In the embodiment for cycling wordline decoder, the MOSFETs Q11 to Q1M in row 1 and the MOSFETs QN1 to QNM in row N pair together and the rest of the adjacent rows pair together. Row 2 has been selected to provide the load element only for ease of explanation.

In another embodiment, both the selected wordline and the wordline for the NVM cells which will function as the load elements are supplied with the maximum high voltage $V_\phi$ such that all the NVM cells connected to the two wordlines are operated in linear mode and the source and drain electrodes of all the NVM cells connected to the two wordlines are linked with the inverted mobile carriers in the channel regions of the MOSFETs in the NVM cells. The common source line CSL for the load elements is biased with positive voltage $V_{DDR}$ or $V_{SS}$ (ground), while the common source line CSL for the NVM cells connected to the selected wordline so that the information stored in these NVM cells can be read out is biased with $V_{SS}$ (ground) or a positive voltage $V_{DDR}$. The output voltages at the bitlines are initially at ½ $V_{DDR}$. The voltage for the selected wordline connected to the row of NVM cells the information in which is to be read out, is then lowered to a constant voltage or stepped voltages are applied to this wordline, to probe the threshold voltages of the MOSFETs in the row of NVM cells connected to the selected wordline. The NVM cells connected to the selected wordline will respond to the applied wordline voltage as this voltage is lowered to shut off the NVM cells according to the threshold voltage levels representing the information stored in the MOSFETs in the NVM cells. The potentials on the bitlines $B_1$ to $B_M$ will either rise toward $V_{DDR}$ or drop toward $V_{SS}$ depending on whether the CSL for the load NVM cells is connected to $V_{DDR}$ or $V_{SS}$, respectively. Thus the voltage potentials at the bitlines $B_1$ to $B_M$ will vary accordingly as a function of the voltages applied to the selected wordline connected to the row of NVM cells containing the information to be read out and the MOSFET threshold voltage levels representing the information stored in these NVM cells. The corresponding potentials on the bitlines $B_1$ to $B_M$ can be sensed, amplified, compared, determined, and converted into the digital information stored in each of the NVM cells connected to the selected wordline as described above and in above-mentioned application Ser. No. 11/378,074 entitled "Bit Symbol Recognition Method and Structure for Multiple Bit Storage in Non-Volatile Memories".

What is claimed is:

1. An NVM Array which comprises:
   a plurality of strings of NVM cells; and
   a multiplicity of 2N wordlines;
   wherein each string comprises:
   a multiplicity "2N" of NVM cells, where "2N" is a selected integer representing the number of NVM cells in a string and each string further comprises a first substring of N NVM cells, and a second substring N NVM cells, with each substring having a first end and a second end;
   a bitline capable of connecting the first end of the first substring to the second end of the second substring;
   a first source of a first selected voltage capable of being connected to the second end of said first substring;
   a second source of a second selected voltage capable of being connected to the first end of said second substring; and
   each of said 2N wordlines capable of being connected to one corresponding NVM cell in each string.

2. The NVM array of claim 1 wherein each string further comprises:
   a first transistor for connecting the first end of said first substring to the bitline;
   a second transistor for connecting the second end of said second substring to the bitline;
   a third transistor for connecting the second end of said first substring to said first source; and
   a fourth transistor for connecting the first end of said second substring to said second source.

3. The NVM array of claim 1 wherein:
   said first selected voltage comprises a bias voltage; and
   said second selected voltage comprises a reference voltage.

4. The NVM array of claim 3 wherein said reference voltage comprises $V_{SS}$ and said bias voltage comprises $V_{DDR}$.

5. The NVM array of claim 1 wherein:
   said first selected voltage comprises a reference voltage; and
   said second selected voltage comprises a bias voltage.

6. The NVM array of claim 5 wherein said reference voltage comprises $V_{SS}$ and said bias voltage comprises $V_{DDR}$.

7. A method of operating an NVM array wherein said NVM array comprises a plurality of M strings of NVM cells, each string being associated with a bitline, where M is a selected integer representing the number of strings and the number of bitlines, each string comprising a multiplicity of NVM cells, and each string further comprising a first substring of NVM cells and a second substring of NVM cells, with each substring having a first end and a second end, and a multiplicity of wordlines, the $n^{th}$ wordline, where "n" is an integer given by $1 \leq n \leq N$ and N is the maximum number of wordlines, being connected to M NVM cells in a corresponding row of NVM cells, the $m^{th}$ NVM cell in said row, where "m" is an integer have a value given by $1 \leq m \leq M$, being part of the $m^{th}$ string, said method comprising in connection with each of said M strings;
   connecting the bitline associated with said string to the first end of the first substring and to the second end of the second substring;
   connecting a first source of a first selected voltage to the second end of said first substring;
   connecting a second source of a second selected voltage to the first end of said second substring;
   applying a first wordline voltage to all but a selected wordline; and
   applying a selected number of voltages in sequence to the selected wordline to thereby generate on the bitline associated with each string a voltage representing any information stored on the NVM cell connected to both said bitline and said selected wordline.

8. The method of claim 7 further comprising providing in each string:
   a first transistor to connect the corresponding bitline to the first end of said first substring;
   a second transistor to connect the corresponding bitline to the second end of said second substring;
   a third transistor to connect the second end of said first substring to said first source; and
   a fourth transistor to connect the first end of said second substring to said second source.

9. The method of claim 7 wherein said first selected voltage comprises a bias voltage and said second selected voltage comprises a reference voltage.

10. The method of claim 9 wherein said reference voltage comprises ground.

11. The method of claim 7 wherein said first selected voltage comprises a reference voltage and said second selected voltage comprises a bias voltage.

12. The method of claim 11 wherein said reference voltage comprises ground.

13. An NVM array comprising:
a plurality of M bitlines;
a plurality of M strings of NVM cells, each string being associated with one of said M bitlines, where M is a selected integer representing the number of strings and the number of bitlines, each string comprising a multiplicity of P NVM cells, where P is a selected integer, said P NVM cells being divided into a first substring of NVM cells and a second substring of NVM cells, with each substring having a first end and a second end; and
a multiplicity of P wordlines with the $p^{th}$ wordline, where "p" is an integer given by $1 \leq p \leq P$, being connected to M NVM cells in a corresponding row of NVM cells, the $m^{th}$ NVM cell in said row, where "m" is an integer having a value given by $1 \leq m \leq M$, being part of the $m^{th}$ string.

14. The NVM array of claim 13, including a sense amplifier associated with each bitline.

15. The NVM array of claim 13 wherein the first substring contains a different number of NVM cells than the second substring.

16. The NVM array of claim 13 wherein the first substring contains the same number of NVM cells as the second substring.

17. The NVM array of claim 13 wherein each string further comprises:
a first transistor for connecting the first end of said first substring to the bitline;
a second transistor for connecting the second end of said second substring to the bitline;
a third transistor for connecting the second end of said first substring to a first source of a first voltage; and
a fourth transistor for connecting the first end of said second substring to a second source of a second voltage.

18. The NVM array of claim 17 wherein:
said first voltage comprises a bias voltage; and
said second voltage comprises a reference voltage.

19. The NVM array of claim 18 wherein said reference voltage comprises $V_{SS}$ and said bias voltage comprises $V_{DDR}$.

20. The NVM array of claim 17 wherein:
said first voltage comprises a reference voltage; and
said second voltage comprises a bias voltage.

21. The NVM array of claim 20 wherein said reference voltage comprises $V_{SS}$ and said bias voltage comprises $V_{DDR}$.

22. An NVM array comprising:
a plurality of M strings of NVM cells, each string comprising N NVM cells and a bitline, wherein the NVM cells in each string are arranged in pairs, with each NVM cell in each pair having a first electrode connected at a first node to a first electrode of the other NVM cell in the pair and having a second electrode connected to the bitline in the string, where M and N are selected integers;
a multiplicity of N wordlines, each wordline being connected so as to be capable of supplying a voltage to a corresponding NVM cell in each string;
a multiplicity of electrically conductive lines, each line connecting one first node in one string of NVM cells to a corresponding first node in each other string of NVM cells; and
a first source of voltage and a second source of voltage wherein one or the other of said sources is capable of being connected to each electrically conductive line.

23. The NVM array of claim 22 further comprising:
a first switch for applying a first voltage to a first selected one of said electrically conductive lines; and
a second switch for applying a second voltage to a second selected one of said electrically conductive lines.

24. The NVM array of claim 23 wherein said first voltage is $V_{DDR}$ (or $V_{SS}$) and said second voltage is $V_{SS}$ (or $V_{DDR}$).

25. The NVM array of claim 24 wherein the NVM cells in the row of NVM cells with each NVM cell having one electrode connected to said first selected one of said electrically conductive lines, are selected to have any information stored in said NVM cells read out on the corresponding bitlines and the NVM cells in the row of NVM cells with each NVM cell having one electrode connected to said second selected one of said electrically conductive lines, are selected to serve as load elements for the reading out of said information.

26. An NVM Array which comprises:
a plurality of strings of NVM cells, wherein each string comprises:
a first substring of NVM cells and a second substring of NVM cells, with each substring having a first end and a second end;
a bitline for connecting the first end of the first substring to the second end of the second substring;
a first source of a first selected voltage capable of being connected to the second end of said first substring; and
a second source of a second selected voltage capable of being connected to the first end of said second substring; and
a multiplicity of wordlines; each wordline being connected to one corresponding NVM cell in each string.

27. The array of claim 26, wherein said first substring and said second substring have the same number of NVM cells.

28. The array of claim 26 further comprising a first transistor for connecting the first end of the first substring to said bitline and a second transistor for connecting the second end of the second substring to said bitline.

29. The array of claim 26 further comprising:
a third transistor for connecting a first source of a first selected voltage to the second end of said first substring; and
a third transistor for connecting a second source of a second selected voltage to the first end of said second substring.

30. The array of claim 26 further comprising sense amplifiers for sensing the voltages on the bitlines in the array.

* * * * *